United States Patent
Steffan et al.

(10) Patent No.: US 6,177,287 B1
(45) Date of Patent: Jan. 23, 2001

(54) SIMPLIFIED INTER DATABASE COMMUNICATION SYSTEM

(75) Inventors: Paul J. Steffan, Elk Grove; Allen S. Yu, Fremont, both of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/162,112

(22) Filed: Sep. 28, 1998

(51) Int. Cl.⁷ ............................. G01R 31/26; A01L 21/66
(52) U.S. Cl. ................. 438/14; 438/16; 250/559.43; 250/559.42; 250/559.19; 250/559.05; 250/559.67; 356/273.2; 356/237; 356/243.4; 700/110; 700/121
(58) Field of Search .................. 438/14, 16; 250/559.43, 250/559.42, 559.19, 559.05, 559.07; 356/237.2, 243.4, 237; 382/149; 700/110, 121

(56) References Cited

U.S. PATENT DOCUMENTS

| | | | |
|---|---|---|---|
| 5,129,009 | * | 7/1992 | Lebeau ........................... 382/8 |
| 5,479,252 | * | 12/1995 | Worster et al. .................. 356/237 |
| 5,801,965 | * | 9/1998 | Takagi et al. .................... 364/552 |
| 5,862,055 | * | 1/1999 | Chen et al. ...................... 700/121 |
| 5,917,588 | * | 6/1999 | Addiego ........................... 356/237 |
| 5,943,437 | * | 8/1999 | Sumie et al. .................... 382/149 |
| 5,966,459 | * | 10/1999 | Chen et al. ...................... 382/149 |
| 5,999,003 | * | 12/1999 | Steffan et al. ................... 324/537 |
| 6,011,619 | * | 1/2000 | Steffan et al. ................... 356/237.3 |
| 6,035,244 | * | 3/2000 | Chen et al. ...................... 700/110 |

\* cited by examiner

*Primary Examiner*—John F. Niebling
*Assistant Examiner*—Jonathan Hach
(74) *Attorney, Agent, or Firm*—H. Donald Nelson

(57) ABSTRACT

A method of reviewing classification data and image data for defects detected in a series of semiconductor manufacturing processes. An inspection wafer is selected from a production lot of wafers and is inspected after the completion of each of the series of semiconductor manufacturing processes. The classification data for each defect is sent to a defect management system and an image for selected defects is sent to an image storage system. Identification data is sent to the defect management system and the image storage system. The image storage system sends a cookie to the defect management system allowing the defect management system to identify defects having an image. A operator controlled review station allows an operator to select defects for review that have an image available for review.

1 Claim, 4 Drawing Sheets

SIMPLIFIED INTER DATABASE COMMUNICATION SYSTEM

BACKGROUND OF THE INVENTION

1. Field of the Invention

This invention relates generally to a methodology for the efficient review of defects detected during the manufacture of high performance semiconductor devices. Even more specifically, this invention relates to a methodology for the efficient review of defect images for selected defects detected and classified during the manufacture of high performance semiconductor devices.

2. Discussion of the Related Art

In order to remain competitive, a semiconductor manufacturer must continuously increase the performance of the semiconductor integrated circuits being manufactured and at the same time, reduce the cost of the semiconductor integrated circuits. Part of the increase in performance and the reduction in cost of the semiconductor integrated circuits is accomplished by shrinking the device dimensions and by increasing the number of circuits per unit area on an integrated circuit chip. Another part of reducing the cost of a semiconductor chip is to increase the yield. As is known in the semiconductor manufacturing art, the yield of chips (also known as die) from each wafer is not 100% because of defects caused by the manufacturing process. The number of good chips obtained from a wafer determines the yield. As can be appreciated, chips that must be discarded because of a defect increases the cost of the remaining usable chips.

A single semiconductor wafer can require numerous process steps such as an oxidation step, an etch process, a metallization process, rapid thermal anneal (RTA) and wet chemical cleaning. Some of these process steps involve placing the wafer on which the semiconductor chips are being manufactured into different tools during the manufacturing process. The optimization of each of these process steps requires an understanding of a variety of chemical reactions and physical processes in order to produce high performance, high yield circuits. The ability to view and characterize the surface and interface layers of a semiconductor chip in terms of their morphology, chemical composition and distribution is an invaluable aid to those involved in research and development, process, problem solving, and failure analysis of integrated circuits. A major part of the analysis process is to determine if defects are caused by one of the process tools, and if so, which tool caused the defects.

As the wafer is placed into different tools during manufacture, each of the tools can produce different types of particles that drop onto the wafer and cause defects that have the potential to decrease the yield. In order to develop high yield semiconductor processes and to improve existing ones, it is important to identify the sources of the various particles that cause defects and then to prevent the tools from dropping these particles onto the wafer while the wafers are in the tools.

In order to be able to quickly resolve process or equipment issues in the manufacture of semiconductor products, a great deal of time, effort and money is being expended by semiconductor manufacturers to capture and classify silicon based defects. Once a defect is caught and properly described and classified, only then can work begin to resolve the cause of the defect and to eliminate the cause of the defect.

The methods of classifying a defect include making and storing an image of certain defects for evaluation. Because the evaluation of defects images is time intensive, it is necessary to store images for later evaluation. In addition, because storage of defect images is memory intensive, it is not practical to store image data for all defects. The defect image data is stored in an image storage system and classification data is stored in a defect management system. In order for a reviewer to review and evaluate defects, it is necessary for the reviewer to search both the defect management system and the defect image storage system to determine if there is image data corresponding to the classification data.

Therefore, what is needed is a method of storing image data and classification data in such a way that an evaluator can determine immediately if there is image data corresponding to the classification data for a particular defect.

SUMMARY OF THE INVENTION

The present invention overcomes the above problems of prior art defect evaluation methodologies through a method of storing classification data in defect management system and image data in a an image storage system. Identification data is sent to both the defect management system and the image storage system. The image storage system sends a cookie to the defect management system that allows the defect management system to identify those defects that have a captured image.

In accordance with an aspect of the invention, the identification data sent to the defect management system and the image storage system includes a production lot number, a wafer number, a layer number and a defect number.

In accordance with another aspect of the invention, an operator controlled review station can immediately display the defect classification data and image data for those defects that are identified a shaving corresponding image data.

The described method provides an improved method of evaluating defect data by allowing a reviewer to review and evaluate the classification data and image data for defects that are identified as having corresponding images. The classification data and image data is reviewed at an operator controlled review station that displays defect data and identifies those defects that have corresponding images thus allowing the reviewer to select those defects that have corresponding images.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to a specific embodiment of the present invention, which illustrates the best mode presently contemplated by the inventors for practicing the invention.

Figure 1A:
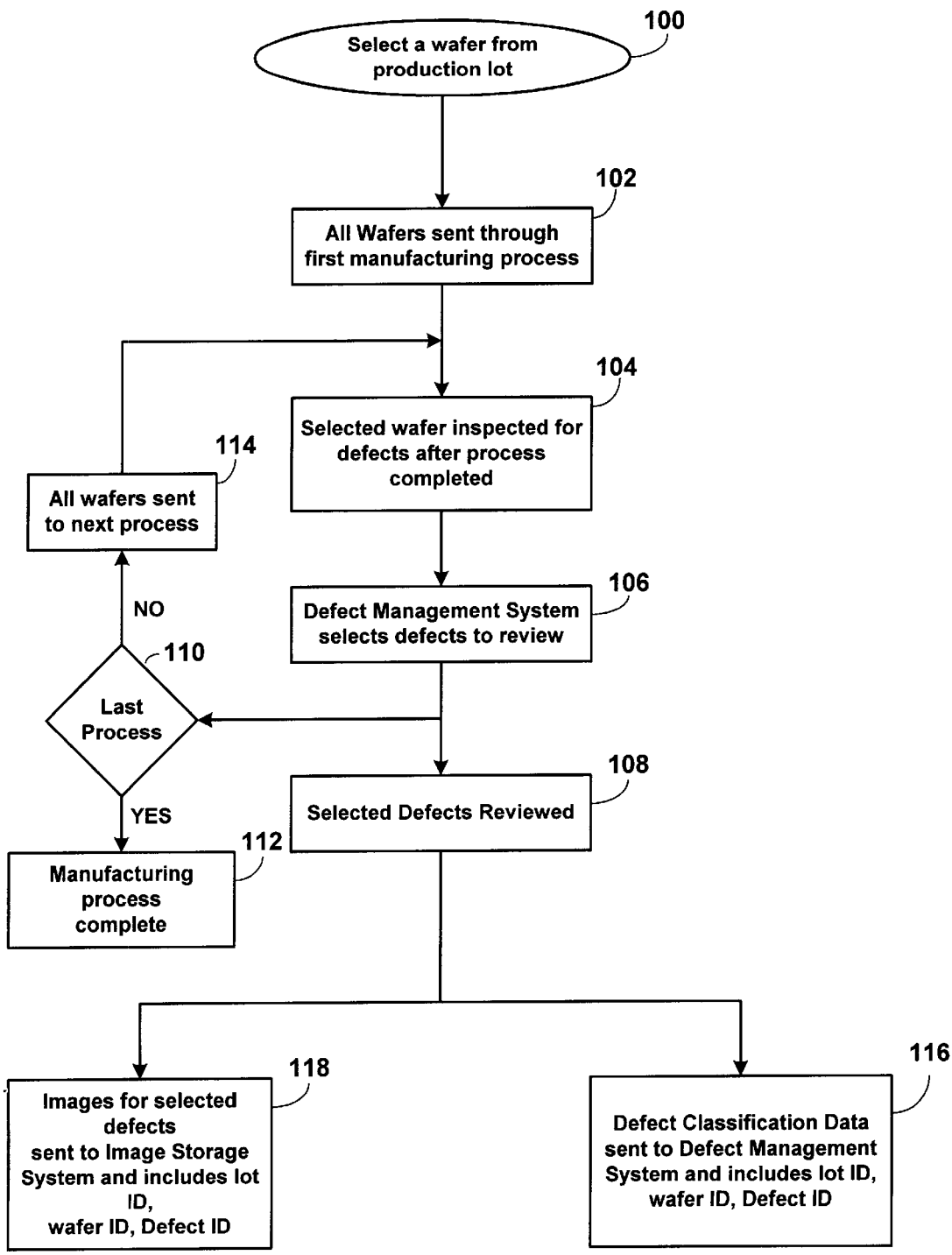
FIG. 1A is a flow diagram of a typical prior art process for collecting and storing classification and image data for defects detected during the manufacturing of semiconductor integrated devices.

FIG. 1A is a flow diagram of a typical prior art process for collecting and storing classification and image data for defects detected during the manufacturing of semiconductor integrated devices. The manufacturing process of semiconductor integrated devices starts by selecting one or more inspection wafers to be inspected from a production lot, as indicated at 100. All the wafers in the production lot, including the one or more selected wafers are sent through a first manufacturing process at 102. After the first manufacturing process is completed, the selected inspection wafer or wafers are inspected for defects, at 104. In the field of semiconductor manufacturing there are several types of systems utilized in the discipline of defect analysis. These systems manage defect information and images captured by scan tools and review tools in the course of regular production operations. The scan tool captures defects and creates a file that describes the defect uniquely for a given production lot, layer, wafer, defect identification and location on the wafer. This information is stored in a defect management system (DMS). The inspection wafer or wafers are subsequently loaded into one of multiple review stations along with the wafer information from the defect management system where the defects are classified and images can be captured, in this case, with an analog capture of a video output that is input to an image storage system. The review station requests an image capture and a small text file is sent to the image storage system as well as the pertinent information for the defect in question. The pertinent information includes production lot number, the wafer number, the layer number and the defect number. The image storage system sends a small file back to the review station containing information concerning the image identification and location of the image. The review station then communicates with the defect management system to let it know the image information so that the defect can be linked with the image. The required two-way communication between the image storage system and the review station is both time consuming and requires extra software development.

The defect management system selects detected defects to review at 106 that are reviewed at 108. After the defect management system selects defects to review at 106, it is determined at 110 whether the process just completed is the last process. If it is determined that the process just completed is the last process, the manufacturing process is complete, as indicated at 112. If it is determined that the process just completed is not the last process, all the wafers are sent to the next process 114. After the next process at 114 is completed the selected wafer is inspected at 104 and the process is repeated until the manufacturing process is completed.

After the selected defects are reviewed at 108, defect classification data is sent to the defect management system at 116. Included with the defect classification data sent to the defect management system is data to identify the defect such as production lot identification, wafer identification and defect identification. For those defects for which images are captured, image data is sent to an image storage system at 118. Included with the image data sent to the image storage system is data to identify the defect such as production lot identification, wafer identification and defect identification.

Figure 1B:
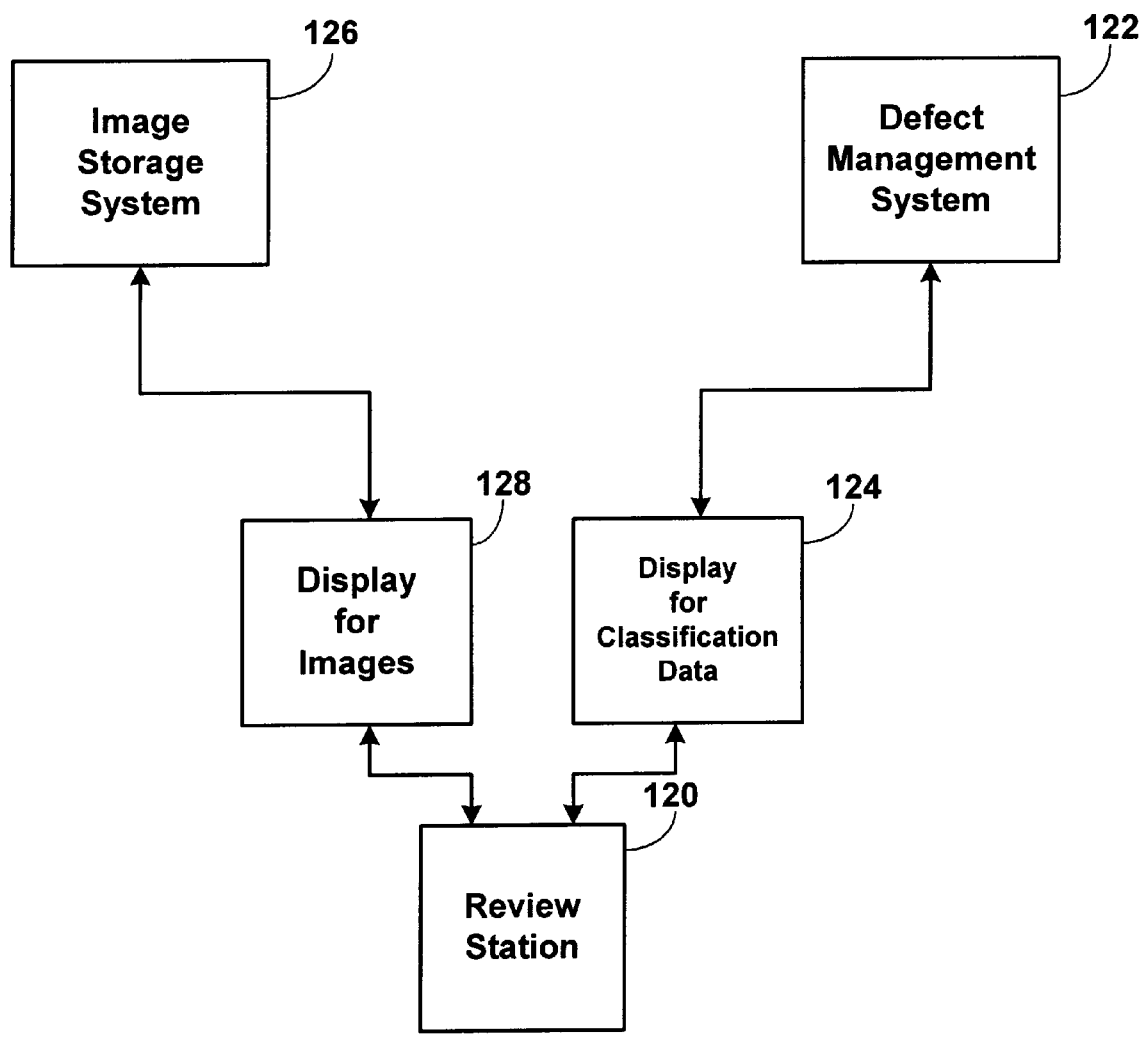
FIG. 1B illustrates the methodology of reviewing the classification and image data collected and stored as described in the flow diagram in FIG. 1A.

FIG. 1B illustrates the methodology of reviewing the classification and image data collected and stored as described in the flow diagram in FIG. 1A. A reviewer at the review station 120 reviews defect data from the defect management system 122 on the display 124. The reviewer displays defect data on the display 124 and selects a defect to evaluate further. At this point, the reviewer does not know if there is an image associated with the defect that the reviewer wants to review. In order to determine whether there is an image, the reviewer must review the image data stored in the image storage system 126 at the display 128. If there is an image for the defect, the reviewer then reviews the defect at the display 128.

Figure 2A:
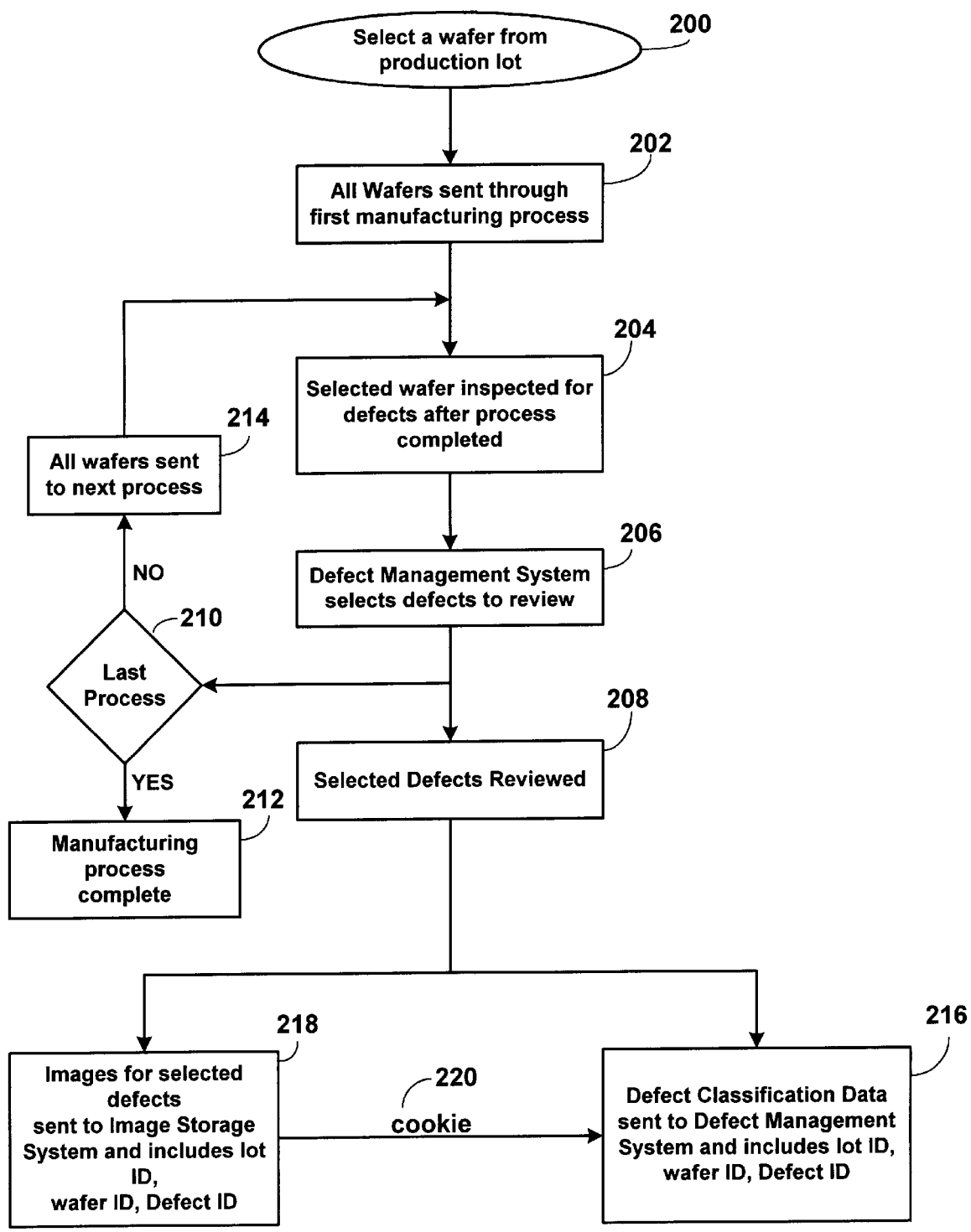
FIG. 2A is a flow diagram of a process in accordance with the present invention for collecting and storing classification and image data for defects detected during the manufacturing of semiconductor integrated devices.

FIG. 2A is a flow diagram of a process in accordance with the present invention for collecting and storing classification and image data for defects detected during the manufacturing of semiconductor integrated devices. The manufacturing process starts by selecting an inspection wafer to be inspected from a production lot, as indicated at 200. All the wafers in the production lot, including the selected wafer are sent through a first manufacturing process at 202. After the first manufacturing process is completed, the selected inspection wafer is inspected for defects, at 204. The function of systems utilized in the discipline of defect analysis are the same as described above with the exceptions described below. The defect management system selects detected defects to review at 206 that are reviewed at 208. After the defect management system selects defects to review at 206, it is determined at 210 whether the process just completed is the last process. If it is determined that the process just completed is the last process, the manufacturing process is complete, as indicated at 212. If it is determined that the process just completed is not the last process, all the wafers are sent to the next process 214. After the next process at 214 is completed the selected wafer is inspected at 204 and the process is repeated until the manufacturing process is completed.

After the selected defects are reviewed at 208, defect classification data is sent to the defect management system at 216. Included with the defect classification data sent to the defect management system is data to identify the defect such as production lot identification, wafer identification and defect identification. For those defects for which images are captured, image data is sent to an image storage system at 218. Included with the image data sent to the image storage system is data to identify the defect such as production lot identification, wafer identification and defect identification. The image storage system sends a cookie 220 to the defect management system for each image received by the defect management system. The cookie sent to the defect management system includes identification data that allows the defect management system to identify defects that have captured images available for review.

Figure 2B:
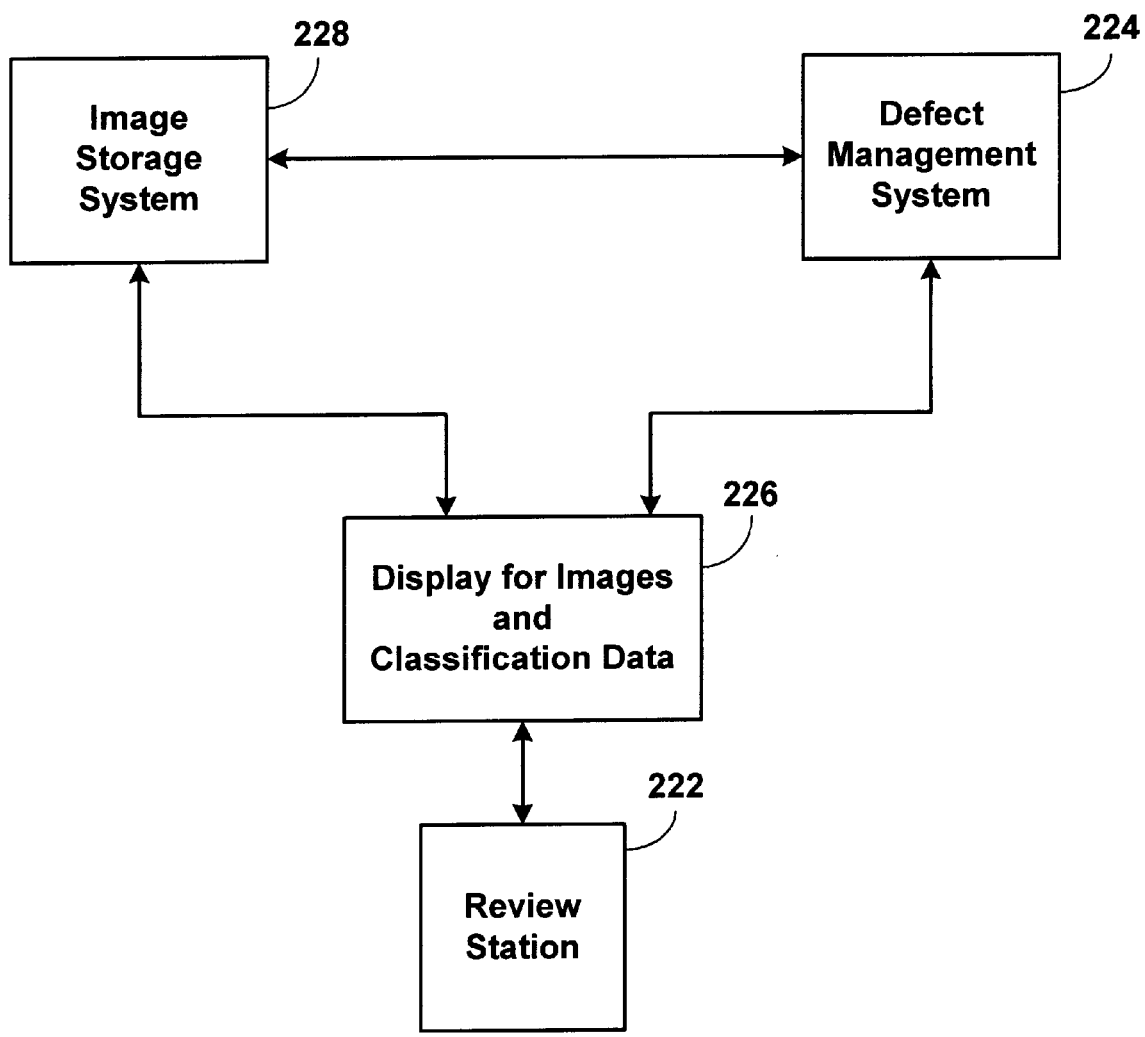
FIG. 2B illustrates the methodology of reviewing the classification and image data collected and stored in the process in the flow diagram in FIG. 2A.

FIG. 2B illustrates the methodology of reviewing the classification and image data collected and stored as described in the flow diagram in FIG. 2A. A reviewer at the review station 222 reviews defect data from the defect management system 224 on the display 226. The reviewer displays defect data on the display 226 and can select to review classification data and the associated defect image because it is identified on the display 226 that the particular defect of interest has a stored image available for review. The image is stored in the image storage system 228. The image can be sent to the display 226 in one of two ways, first, by sending the image to the display 226 via the defect management system 224 or directly to the display 226.

The benefits of the invention include:
1. Reduces defect review cycle time;
2. Eliminates the need for expensive software development for each review tool vendor; and
3. Gives the ability to quickly link any image from any tool with a video output to a defect within DMS for analysis and trending.

In summary, the results and advantages of the method of viewing classification data and images for selected defects of the present invention can now be more fully realized. The method of the present invention allows a reviewer to review and evaluate the classification data and image data for defects that are identified as having corresponding images.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. An automated method of reviewing classification and image data for defects occurring in semiconductor manufacturing, the method comprising:

sending a production lot of wafers through a series of manufacturing processes;

selecting an inspection wafer from the production lot of wafers;

inspecting the inspection wafer for defects after each of the series of manufacturing processes;

selecting a defect to be reviewed by a defect management system;

sending identification data for the selected defect to the defect management system, wherein the identification data includes: production lot identification, wafer identification, and a defect identification label;

capturing an image of said selected defect;

sending said captured image and the identification data to an image storage system, wherein the image storage system is a separate system than the defect management system; and sending a cookie from the image storage system to the defect management system for only each image sent to the image storage system so that the defect management system can identify those defects that have a corresponding captured image, and wherein the cookie includes the identification data;

sending the corresponding identification data and image of the selected defect from the defect management system and image storage system respectively to a review station for evaluation, wherein the review station includes an operator controlled display that simultaneously displays the image of the defect identified by the cookie sent to the defect management system and the identification data sent to the defect management system.

* * * * *